(12) United States Patent
Gong et al.

(10) Patent No.: US 9,006,901 B2
(45) Date of Patent: Apr. 14, 2015

(54) THIN POWER DEVICE AND PREPARATION METHOD THEREOF

(71) Applicants: Yuping Gong, Shanghai (CN); Yan Xun Xue, Los Gatos, CA (US); Ming-Chen Lu, Shanghai (CN); Ping Huang, Shanghai (CN); Jun Lu, San Jose, CA (US); Hamza Yilmaz, Saratoga, CA (US)

(72) Inventors: Yuping Gong, Shanghai (CN); Yan Xun Xue, Los Gatos, CA (US); Ming-Chen Lu, Shanghai (CN); Ping Huang, Shanghai (CN); Jun Lu, San Jose, CA (US); Hamza Yilmaz, Saratoga, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 13/946,949

(22) Filed: Jul. 19, 2013

(65) Prior Publication Data

US 2015/0021780 A1   Jan. 22, 2015

(51) Int. Cl.
  *H01L 23/02*   (2006.01)
  *H01L 23/13*   (2006.01)
  *H01L 23/00*   (2006.01)

(52) U.S. Cl.
  CPC ............... *H01L 23/13* (2013.01); *H01L 24/85* (2013.01); *H01L 24/89* (2013.01)

(58) Field of Classification Search
  USPC ......... 257/678, 693, 675, 706, 707, 718, 726, 257/727, 676, 691, 698, 773, E23.001, 257/E23.02
  See application file for complete search history.

(56) References Cited

U.S. PATENT DOCUMENTS

| | | | | |
|---|---|---|---|---|
| 5,406,120 | A * | 4/1995 | Jones | 257/706 |
| 6,307,755 | B1 * | 10/2001 | Williams et al. | 361/813 |
| 6,335,548 | B1 * | 1/2002 | Roberts et al. | 257/98 |
| 6,545,364 | B2 * | 4/2003 | Sakamoto et al. | 257/773 |

* cited by examiner

*Primary Examiner* — Jasmine Clark
(74) *Attorney, Agent, or Firm* — Chein-Hwa Tsao; CH Emily LLC

(57) ABSTRACT

A thin power device comprises a substrate having a first set of first contact pads at a front surface of the substrate electrically connecting to a second set of second contact pads at a back surface of the substrate, a through opening opened from the front surface and through the substrate exposing a third contact pad at the back surface of the substrate, a semiconductor chip embedded into the through opening with a back metal layer at a back surface of the semiconductor chip attached on the third contact pad, and a plurality of conductive structures electrically connecting electrodes at a front surface of the semiconductor chip with the corresponding first contact pads in the first sets of first contact pads.

6 Claims, 8 Drawing Sheets

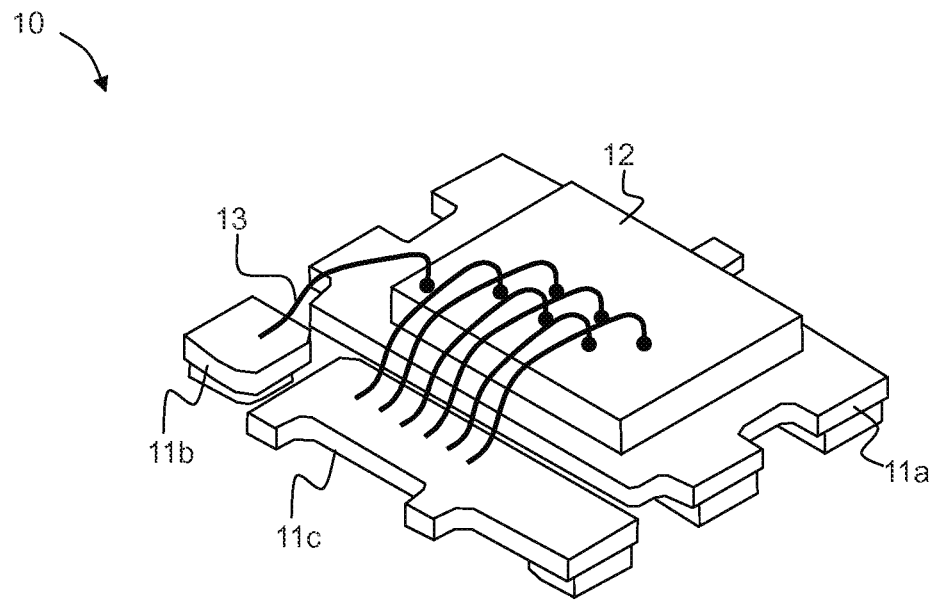
FIG. 1A - Prior Art
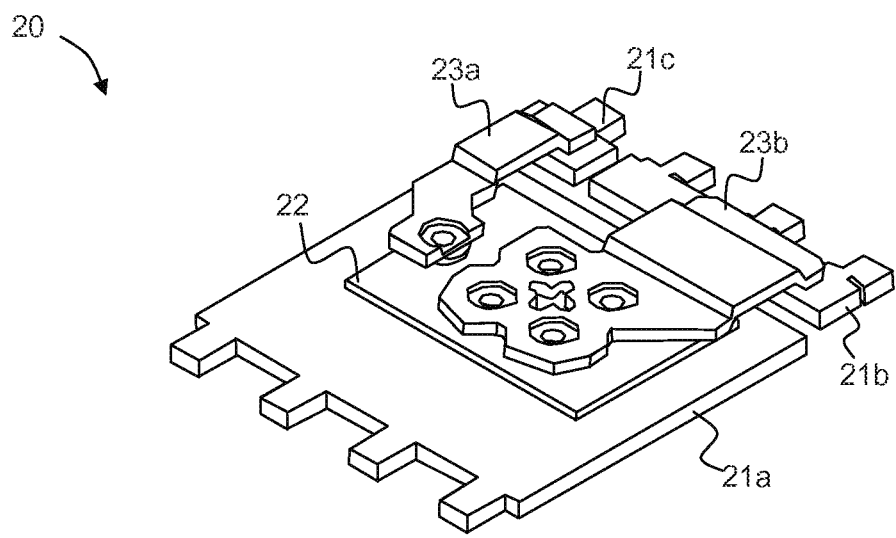
FIG. 1B - Prior Art

US 9,006,901 B2

THIN POWER DEVICE AND PREPARATION METHOD THEREOF

FIELD OF THE INVENTION

The invention generally relates to a power device, particularly relating to a thin power device and a preparation method thereof.

DESCRIPTION OF THE RELATED ART

Traditionally, wire bonding or clip bonding is used for the interconnection in a semiconductor device package; however, such two interconnection modes result in a high loop of the bonding wire or a deep downset (vertical distance between the major portion of the clip to the lead portion of the clip) of the clip, thus the requirements of obtaining a thinner device cannot be met. For example, as shown in FIG. 1A, a power device 10 includes a MOSFET (Metal-Oxide-Semiconductor Field Effect Transistor) 12 attached on a paddle 11a, where the gate electrode of the MOSFET 12 is electrically connected with a pin 11b through a bonding wire 13 and the source electrode is electrically connected with a pin 11c through a plurality of bonding wires 13. The paddle 11a, the pin 11b and the pin 11c all have a significant thickness and the loop of the bonding wire 13 is also high, which results in a thick power device 10. In other packaging modes, as shown in FIG. 1B, a power device 20 includes a metal clip 23a and a metal clip 23b instead of bonding wire for electrical interconnections. The source electrode of the MOSFET 22 is electrically connected with a pin 21b through the metal clip 23b and the gate electrode is electrically connected with a pin 21c through the metal clip 23a. The power device 20 is also thick due to thicker pin 21b, pin 21c and the paddle 21a for mounting the chip. For example, US patent publication 20070114352 discloses a clip structure for a semiconductor package, which has a stepped configuration and is used to connect the gate electrode and the source electrode of a semiconductor die to a plurality of pins in a lead frame. However, the package structure of this prior art is thick and the heat dissipation of the device is poor.

It is within this context that embodiments of the present invention arise.

BRIEF DESCRIPTIONS OF THE DRAWINGS

As shown in attached drawing, the embodiment of the invention is more sufficiently described. However, the attached drawing is only used for explaining and illustrating rather than limiting the scope of the invention.

FIGS. 1A to 1B are perspective views showing power devices of the background art.

DETAILED DESCRIPTIONS OF THE PREFERRED EMBODIMENTS

Figure 2A:
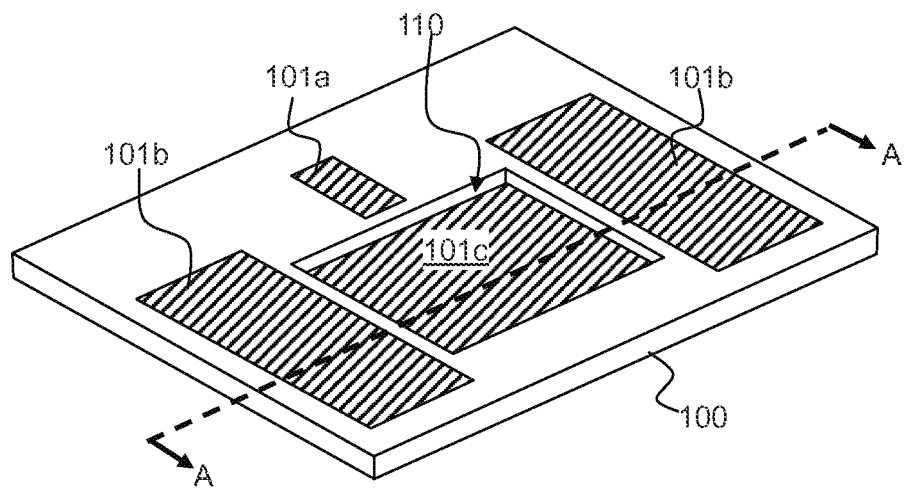
FIGS. 2A to 2B are perspective views showing the front and back surfaces of a substrate respectively.
Figure 2B:
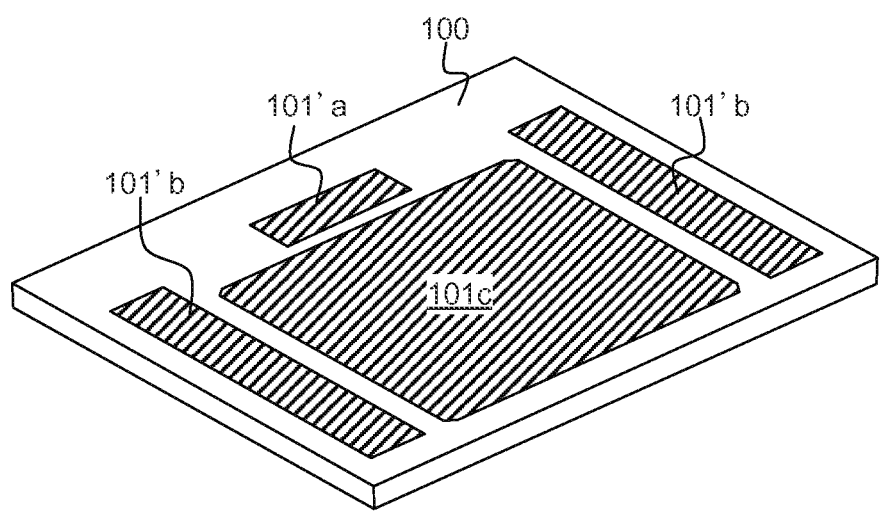
Figure 2C:
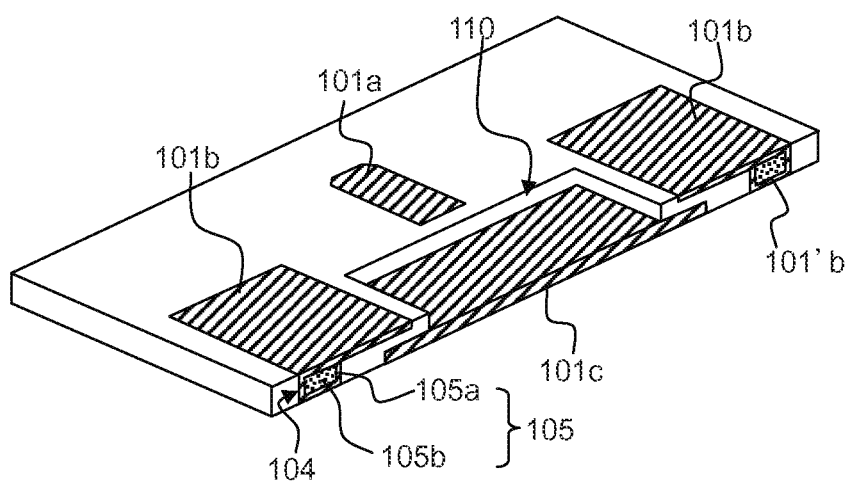
FIG. 2C is a perspective view showing a cross sectional diagram of the substrate along the line AA in FIG. 2A including an interconnecting structure formed in a trench.

As shown in FIGS. 2A to 2B, a substrate 100 made of an insulation material includes a first set of contact pads arranged at the front surface including a contact pad 101a and a plurality of contact pads 101b and a second set of contact pads arranged at the back surface including a contact pad 101'a, a plurality of contact pads 101'b and at least a contact pad 101c. A rectangular or square opening 110 passing through the substrate 100 is formed in the center area of the substrate 100, which aligns with the contact pad 101c in the second set of contact pads, thus the contact pad 101c is exposed from the front surface of the substrate 100 from the opening 110. FIG. 2C further shows the cross-section of the substrate 100 along the line AA in FIG. 2A. The contact pads 101a and 101b in the first set of contact pads are electrically connected with the corresponding contact pads 101'a and 101'b in the second set of contact pads respectively; for example, each of the contact pads 101a and 101b is electrically connected with a contact pads 101'a or 101b' through an interconnecting structure 105 formed inside the substrate 100 correspondingly. Preferably, each contact pad in the first set of contact pads and the second set of contact pads is made of copper coated with Ni/Au. In addition, the surface of the substrate 100 often is covered with a solder mask that does not cover the first set of contact pads and the second set of contact pads. Alternatively, the opening 110 does not have to be arranged in the center area of the substrate 100, for example, the opening 110 can be positioned at a corner or close to an edge of the substrate 100. In addition, the opening 110 can be any shape, such as round, ellipse, triangle and the likes that can accommodate a semiconductor chip such as chip 115 shown in FIG. 3.

Figure 2D:
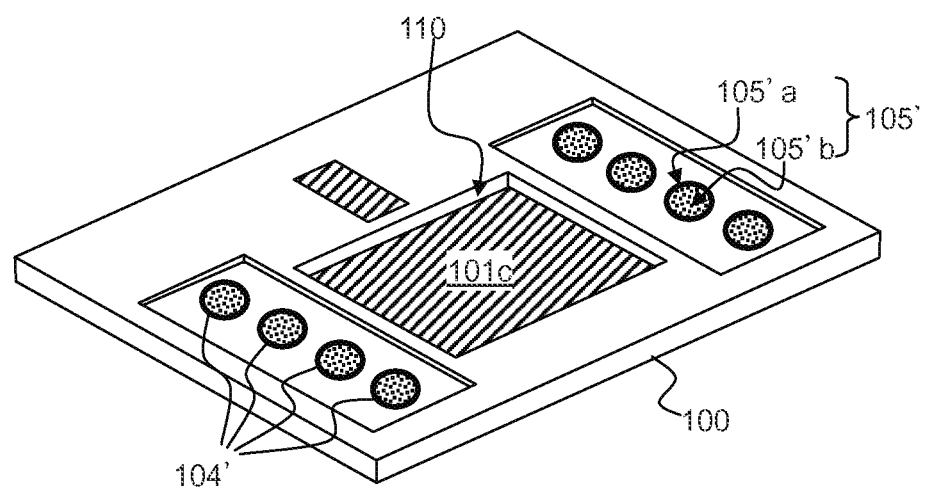
FIG. 2D is perspective view showing a substrate including an interconnecting structure formed in a through hole.

In a preferred embodiment, each contact pad in the first set of contact pads is overlapped with the corresponding contact pad in the second set of contact pads, for example, the contact pad 101a is overlapped with the contact pad 101'a and the contact pad 101b is overlapped with the contact pad 101'b. As shown in FIG. 2C, a trench 104 is formed in the substrate 100 in the overlapping area between the contact pad 101b and the contact pad 101'b and the interconnecting structure 105 is formed in the trench 104. Preferably, the side wall of the trench 104 is covered with a thin metal layer 105a, for example formed by electroplating, and then the trench 104 is filled with the conductive materials 105b (such as tungsten, soldering paste and the like). As such, the interconnecting structure 105 includes the metal layer 105a and the conductive material 105b. In an alternative embodiment, as shown in FIG. 2D, where the contact pad 101b is drawn transparently for the sake of the clarity, the trench 104 is replaced by a plurality of through holes 104' separated from each other formed in the overlapping area between the contact pad 101b and the contact pad 101'b. Each through hole 104' is lined with a metal layer 105'a on the side wall and then a conductive material 105'b is filled in the through hole 104', as such each interconnecting structure 105' includes the metal layer 105'a and the conductive materials 105'b. Typically, the cross section of the through hole 104' can be in shape of round, ellipse, triangle and the like. Similarly, the interconnecting structure 105 or 105' is formed in the overlapping area of the substrate 100 between the contact pad 101a and the contact pad 101'a, in which the interconnecting structure electrically connects the contact pad 101a and the contact pad 101'a.

Figure 3:
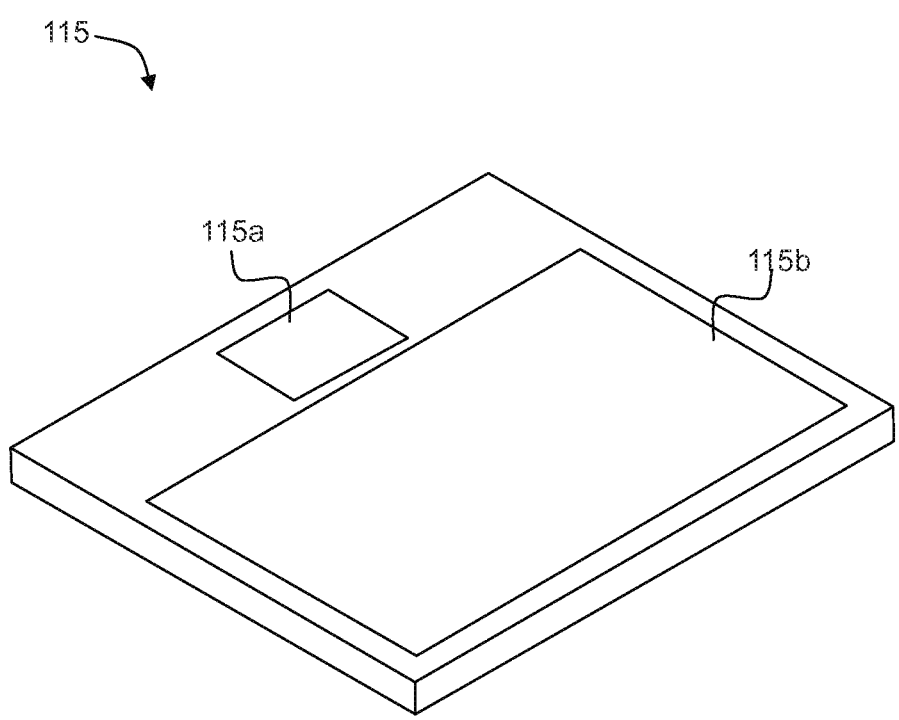
FIG. 3 is a schematic structural diagram of a MOSFET chip.

FIG. 3 is a top view schematic diagram of the chip 115, for example a vertical power MOSFET, in which a gate electrode 115a and a source electrode 115b are arranged on the front surface and a back metal layer, for example Ti/Ni/Ag, covers at the back surface of the chip 115 (not shown) functioning as the drain electrode. As well known in the art, a passivation layer (not shown) is formed to cover the front surface of the chip 115 with the gate electrode 115a and the source electrode 115b exposed from the passivation layer for mechanical protection and electrical isolation.

Figure 4A:
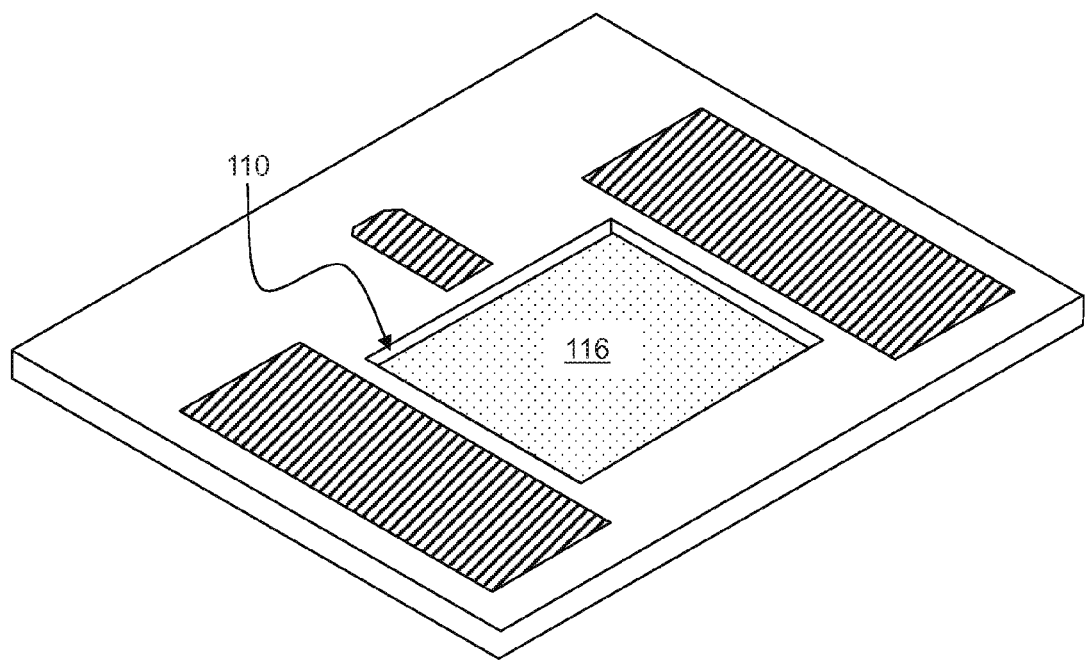
FIGS. 4A to 4E are perspective views showing a method for preparation of the power device.
Figure 4B:
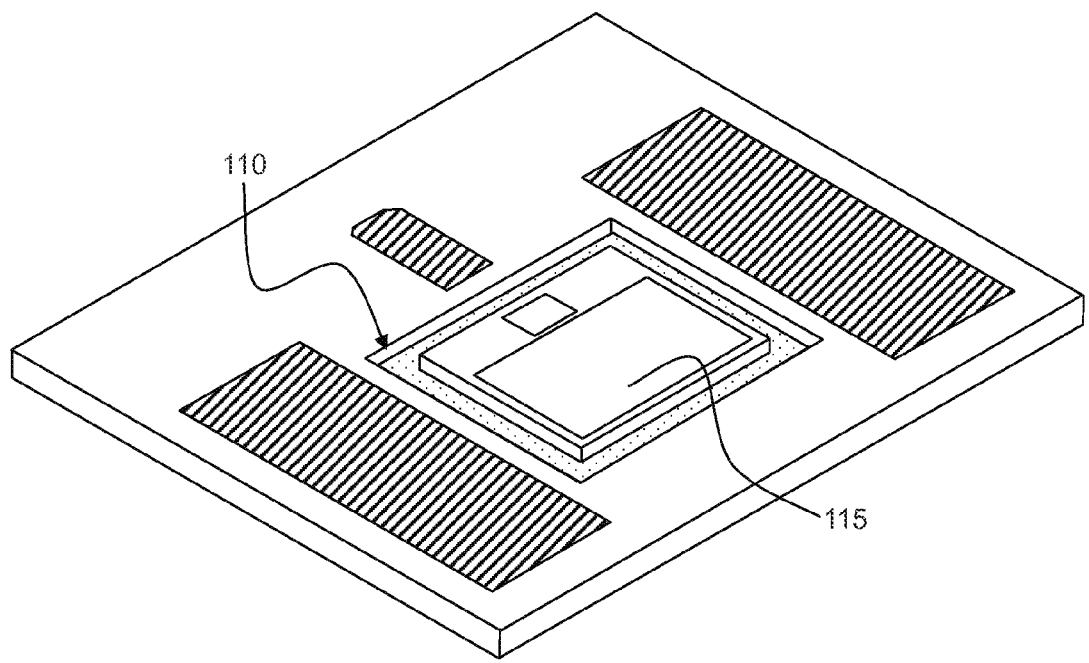
Figure 4C:
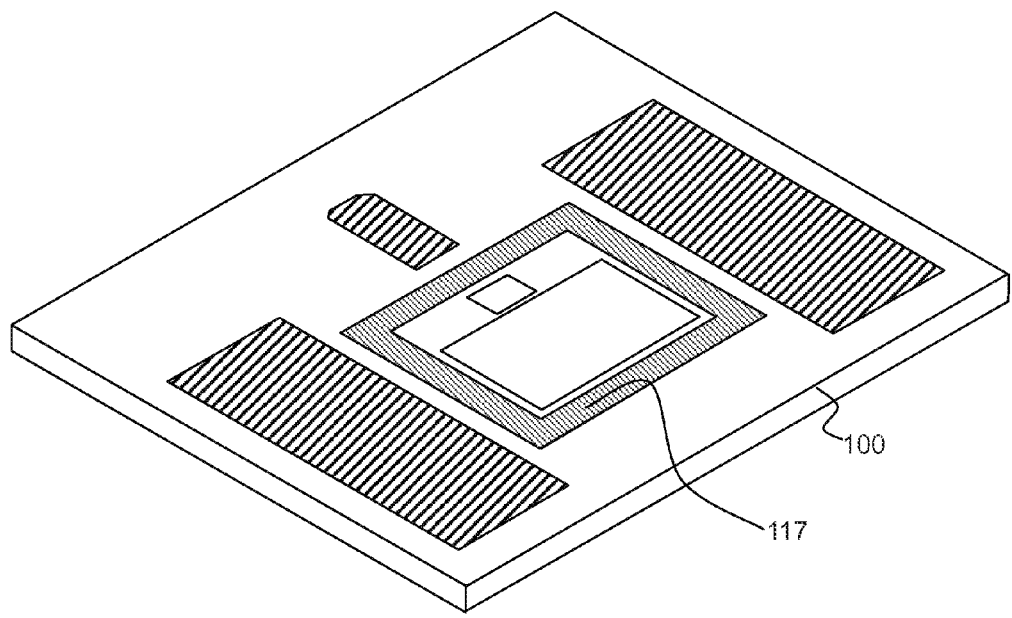
Figure 4D:
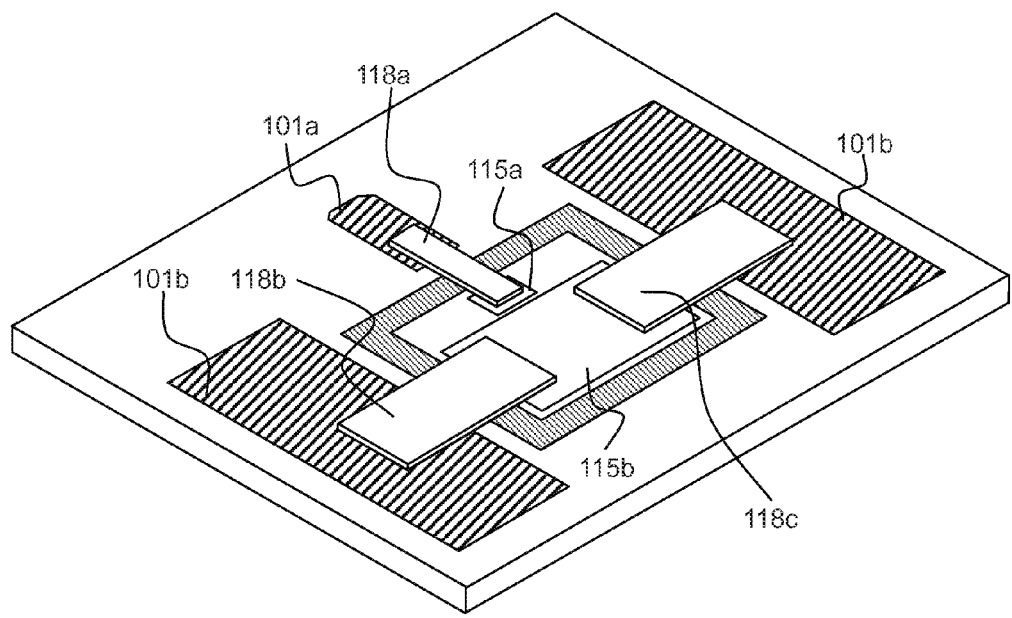
Figure 4E:
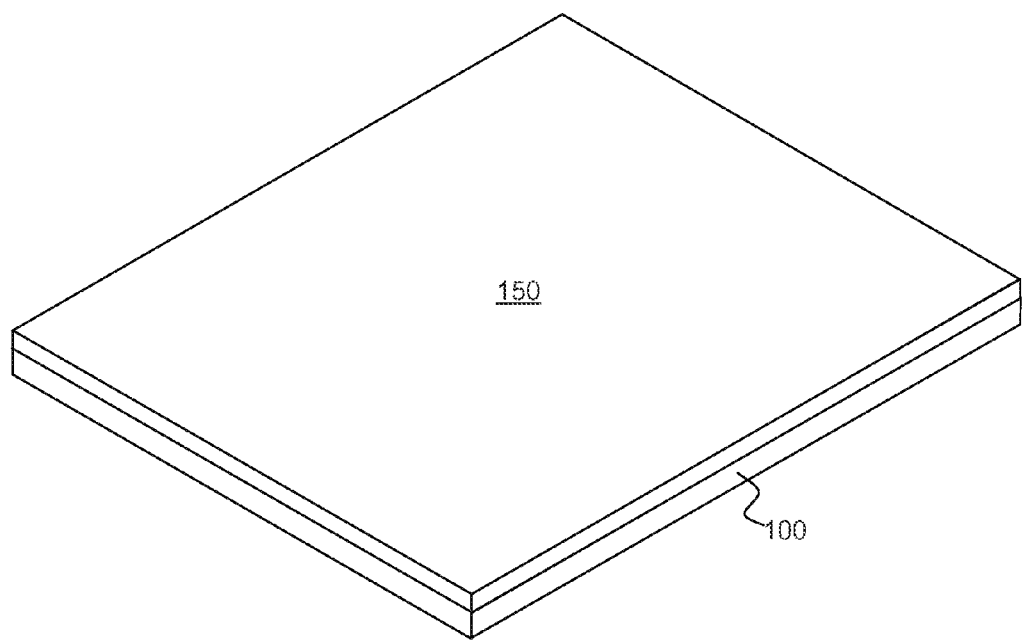

As shown in FIGS. 4A to 4B, a conductive adhesive 116, such as soldering paste or conductive paste, is coated on the area of the contact pad 101c exposing on the opening 110, then the chip 115 is mounted on the conductive adhesive 116 with the chip 115 is embedded into the opening 110. Generally, the size of the contact pad 101c is larger than the size of the opening 110, and the size of the opening 110 is slightly larger than the size of the chip 115, thus a gap exists between the periphery of the chip 115 and the edge of the opening 110. In FIG. 4C, a non-conductive underfill 117 is filled in the gap between the edge of the opening 110 and the periphery of the chip 115. The underfill 117, before curing, is highly flowable so that it occupies the gap completely. In FIG. 4D, a aerosol jet printed strip 118a is formed on the front surface of the substrate 100 atop the top surface of the underfill 117 and the passivation layer at the front surface of the chip 115 for electrically connecting between the electrode 115a and the contact pad 101a. Specifically, the aerosol jet 118a is sprayed from a nozzle and is immediately cured to form a conductive adhesive strip with a thickness of about 6 um-15 um, preferably 10 um. Similarly, as higher current is passed through the source electrode 115b, two aerosol gel printed strips 118b and 118c are formed on the front surface of the substrate 100 atop the top surface of the underfill 117 and the passivation layer at the front of the chip 115 for electrically connecting between the electrode 115b and the contact pads 101b. In the aerosol jet printed process, if the underfill 117 is insufficiently deposited such that the top surface of the underfill 117 is recessed below the front surfaces of the substrate 100 and the passivation layer at the front surface of the chip 115, under the itself-gravity, the aerosol jet printed strip is trended to thinner or even broken off at the boundary of the underfill 117 and the edge of the substrate 100 or the boundary of the underfill 117 and the periphery of the chip 115. If the underfill 117 is excessively such that the top surface of the underfill 117 is concave and above the front surfaces of the substrate 100 and the passivation layer at the front surface of the chip 115, the aerosol gel easily slides down from the top to the two sides thus the aerosol jet printed strip is thinner at the top of the underfill 117 or broken off in the part. Therefore, the deposition of the underfill 117 is very important. Preferably, the top surfaces of the underfill 117, the substrate 100 and the chip 115 are substantially coplanar. And then, as shown in FIG. 4E, the plastic packaging layer 150 is formed by the plastic packaging materials, such as epoxy resin, to cover the front of the substrate 100, the aerosol jet printed strips 118a-118c, chip 115 and the underfill 117.

Figure 5A:
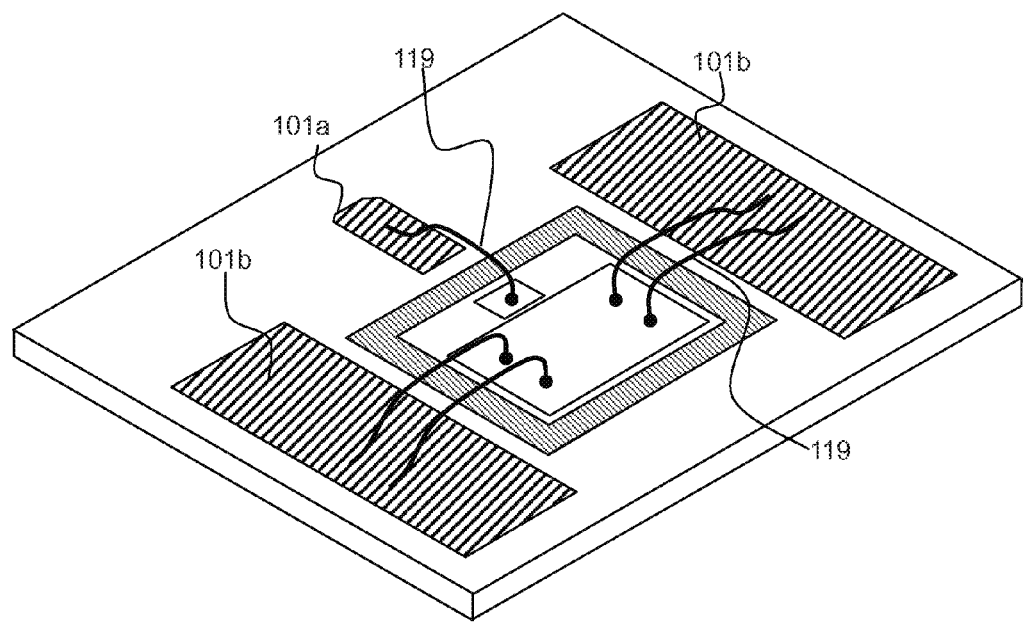
FIGS. 5A to 5B are perspective views showing a power device with bonding wires.
Figure 5B:
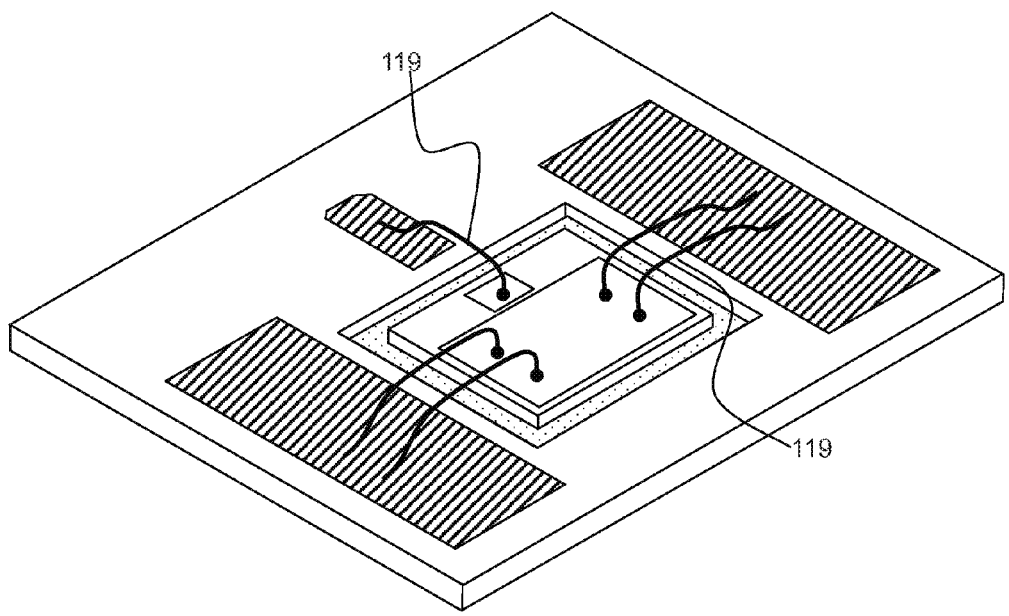

In an alternative device, the aerosol jet printed strips 118a-118c is replaced by the plurality of bonding wires 119 without the mechanical support of the underfill 117 as shown in FIGS. 5A to 5B, which is different from the aerosol jet printed strip as described above. The plastic packaging layer 150 covers the chip 115, the bonding wires 119 and the underfill 117 when the underfill 117 is deposited. When the underfill 117 is not deposited to fill the gap between the edges of the opening 110 and the periphery of the chip 115, the plastic packaging layer 150 covers the spaces between the bonding lead 119 and the chip 115 and further fills in the gap between the edges of the opening 110 and the periphery of the chip 115.

Figure 5C:
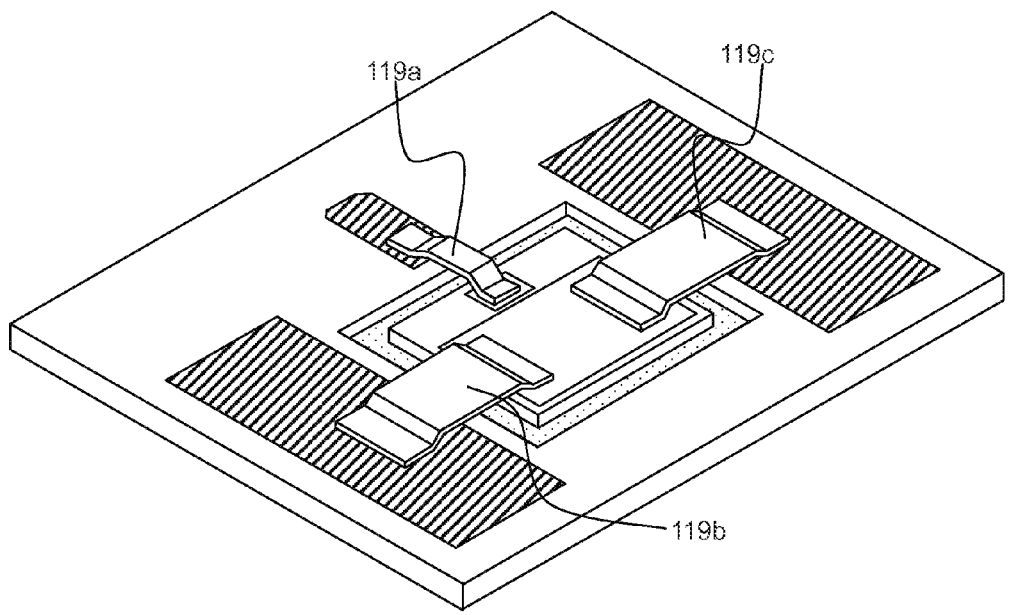
FIG. 5C is perspective view showing a power device with the metal clips.

FIG. 5C shows another alternative device similar to that of FIGS. 5A-5B excepting that the bonding wire 119 is replaced by metal clips 119a-119c. The metal sheets 119a-119c are preferably of bridge structure including a first part and two second parts connected at two sides of the first part, where a plane of the first part is higher than that of the second parts. Two second parts of the metal clip 119a are attached on the electrode 115a and the contact pad 101a close to the electrode 115a respectively by a conductive adhesive. Two second parts of the metal clip 119b are attached on the electrode 115b and the contact pad 101b close to the electrode 115b respectively and the two second parts of the metal clip 119c are attached on the electrode 115b and the contact pad 101b close to the electrode 115b respectively by a conductive adhesive. Similar as described in FIG. 5B, the underfill 117 is optionally deposited. When the underfill 117 is deposited, the plastic packaging layer 150 covers the chip 115, the metal clips 119a-119c and the underfill 117. When underfill 117 is not deposited, the plastic packaging layer 150 covers the metal clips 119a-119c and the chip 115, and further fills in the gap between the edges of the e opening 110 and the periphery of the chip 115.

The contact pad 101'a, 101'b and 101'c at the back surface of the substrate can be defined as the outside gate contact pad, outside source contact pad, and outside drain contact pad, which can be directly mounted with the pad on a PCB (Printed Circuit Board) via the conductive adhesive, such as soldering paste.

When the aerosol jet printed strips 118a-118c are replaced by the bonding wires 119 or the metal clips 119a-119c, the plastic packaging layer 150 is slightly thicker. However, the substrate 100 can be made thinner with the chip 115 embedded in the opening 110, thus the thickness of the final device with the aerosol jet printed strips is substantially equal to the thickness of the bare chip 115.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A thin power device comprising:
    a substrate having a first set of first contact pads arranged at a front surface of the substrate and a second set of second contact pads arranged at a back surface of the substrate, wherein each first contact pad in the first set of contact pads being electrically connected with a second contact pad in the second set of contact pads;
    a through opening opened from the front surface and through the substrate thus exposing a third contact pad at the back surface of the substrate, wherein the third contact pad is one of the second set of second contact pads not electrically connected with any first contact pad in the first set of contact pads;
    a semiconductor chip embedded into the through opening, wherein a back metal layer at a back surface of the chip is attached on the third contact pad; and
    a plurality of conductive structures electrically connecting electrodes at a front surface of the chip with the corresponding first contact pads in the first sets of contact pads.

2. The thin power device according to claim 1, wherein an underfill is filled in a gap between edges of the through opening and a periphery of the chip; and the conductive structure is an aerosol jet printed strip positioned atop front surfaces of the substrate, the underfill and a passivation layer at the front surface of the chip, and electrically connecting an electrode at the front surface of the chip with a corresponding first contact pad in the first set of contact pads closest to the electrode.

3. The thin power device according to claim 2 further comprising a plastic packaging layer covering the front surfaces of the substrate, the semiconductor chip, the underfill and the conductive structure.

4. The thin power device according to claim 1, wherein the conductive structure is a metal clip, a bonding wire or a conductive tape.

5. The thin power device according to claim 4 further comprising a plastic packaging layer covering the front surfaces of the substrate and the semiconductor chip and the conductive structure, wherein the plastic packaging layer is filled in the gap between edges of the through opening and the periphery of the semiconductor chip.

6. The thin power device according to claim 1, wherein a through hole or a trench is formed through the substrate between a first contact pad in the first set of contact pad and a second contact pad in the second set of contact pad underneath the first contact pad and a conductive interconnecting structure is formed in the through hole or the trench electrically connecting the first contact pad and the second contact pad.

* * * * *